United States Patent
Jeong et al.

(10) Patent No.: US 8,349,538 B2
(45) Date of Patent: Jan. 8, 2013

(54) PHOTO-CURABLE AND THERMO-CURABLE RESIN COMPOSITION, AND A DRY FILM SOLDER RESIST

(75) Inventors: Woo-Jae Jeong, Daejeon (KR); Byung-Ju Choi, Daejeon (KR); Bo-Yun Choi, Daejeon (KR); Kwang-Joo Lee, Daejeon (KR); Min-Su Jeong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/180,213

(22) Filed: Jul. 11, 2011

(65) Prior Publication Data

US 2011/0269866 A1    Nov. 3, 2011

Related U.S. Application Data

(63) Continuation of application No. PCT/KR2011/001889, filed on Mar. 18, 2011.

(30) Foreign Application Priority Data

Mar. 22, 2010  (KR) .......................... 10-2010-0025397

(51) Int. Cl.
*G03F 7/00* (2006.01)
*G03F 7/032* (2006.01)

(52) U.S. Cl. .................. 430/270.1; 430/280.1; 522/138; 528/75

(58) Field of Classification Search .............. 430/286.1, 430/270.1, 280.1; 522/173, 174, 138; 528/75
See application file for complete search history.

(56) References Cited

U.S. PATENT DOCUMENTS

| | | | | |
|---|---|---|---|---|
| 5,215,863 A | * | 6/1993 | Nawata et al. | 430/280.1 |
| 5,990,189 A | * | 11/1999 | Hall et al. | 522/79 |
| 6,136,506 A | * | 10/2000 | Hashimoto et al. | 430/280.1 |
| 6,475,701 B2 | * | 11/2002 | Ohno et al. | 430/280.1 |
| 2003/0064304 A1 | * | 4/2003 | Ono et al. | 430/14 |
| 2003/0064305 A1 | * | 4/2003 | Ono et al. | 430/18 |

FOREIGN PATENT DOCUMENTS

| | | |
|---|---|---|
| JP | 2002169285 A | 6/2002 |
| KR | 1020030051419 A | 6/2003 |
| KR | 1020050084003 A | 8/2005 |
| KR | 1020070039531 A | 12/2007 |

OTHER PUBLICATIONS

International Search Report issued in PCT Appln. No. PCT/KR2011/001889 dated Nov. 21, 2011, 6 pages.

* cited by examiner

*Primary Examiner* — Susan W Berman
(74) *Attorney, Agent, or Firm* — Rothwell, Figg, Ernst & Manbeck, P.C.

(57) ABSTRACT

The present invention relates to a photo-curable and thermo-curable resin composition and a dry film solder resist making it possible to provide the dry film solder resist having superior heat-resistance and dimensional stability while exhibiting improved alkali developing properties. The resin composition may comprise an acid-modified oligomer having carboxyl group (—COOH) and photo-curable functional group; a photo-polymerizable monomer comprising a compound having a structure that three or more functional epoxy-acrylate groups are bonded to a heterocyclic structure containing nitrogen, and a functional group having carboxyl group is bonded to at least one epoxy-acrylate group; a thermo-curable binder having thermo-curable functional group; and a photo-initiator.

2 Claims, 1 Drawing Sheet

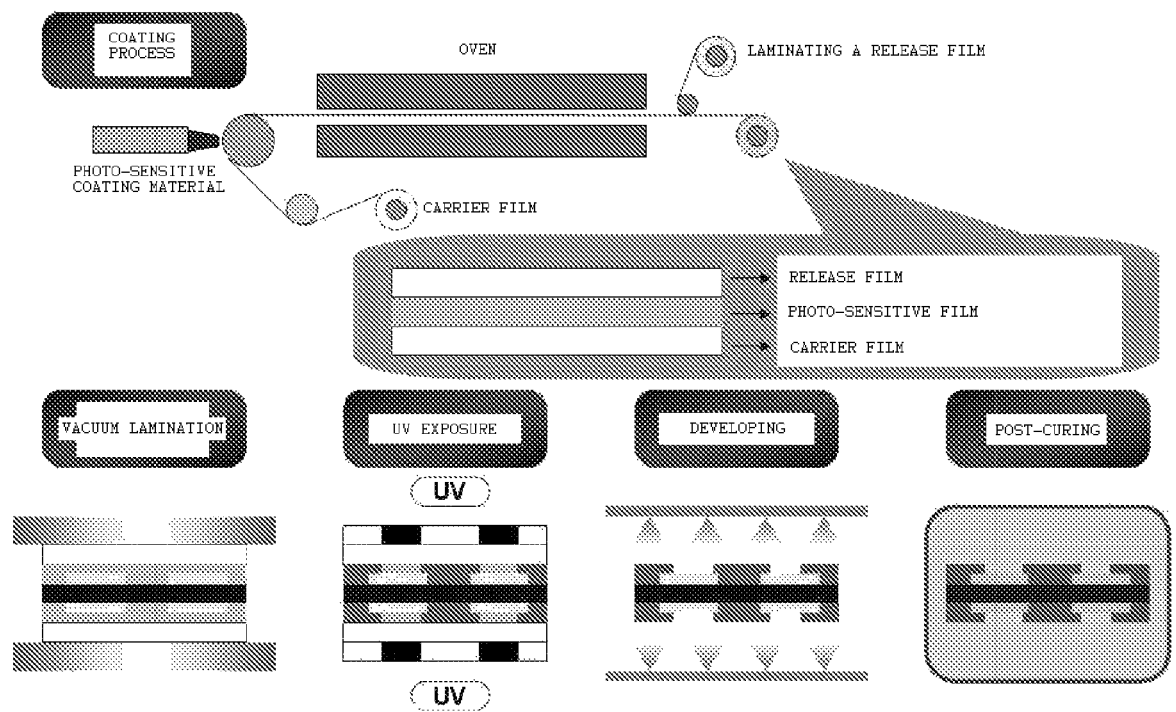

PHOTO-CURABLE AND THERMO-CURABLE RESIN COMPOSITION, AND A DRY FILM SOLDER RESIST

CROSS REFERENCE TO RELATED APPLICATIONS

The present application is a continuation of International Application PCT/KR2011/001889, with an International Filing Date of Mar. 18, 2011, which claims the benefit of Korean patent application no. 10-2010-0025397 filed in the Korea Intellectual Property Office on Mar. 22, 2010, the entire contents of which are incorporated herein by reference.

FIELD OF THE INVENTION

The present invention relates to a photo-curable and thermo-curable resin composition, and a dry film solder resist (hereinafter 'DFSR'). More specifically, the present invention relates to a photo-curable and thermo-curable resin composition which makes it possible to provide a DFSR having superior heat-resistance and dimensional stability while exhibiting more improved alkali developing property, and the DFSR.

DESCRIPTION OF THE RELATED ART

As electronic devices are miniaturized and become lightweight, a photo-sensitive protective film which can form minute open patterns is being used in a printed circuit board (PCB), a semiconductor package board, a flexible printed circuit board (FPCB), and the like.

To the solder resist, the characteristics of developing property, high resolution, insulating property, resistance to soldering heat, tolerance to gold plating, and the like are required. Particularly, for example, crack-resistant property against a temperature cycle test (TCT) from 55° C. to 125° C., or highly accelerated stress test (HAST) property to fine wirings, in addition to said characteristics are required to the solder resist for package board.

Recently, a Dry Film Solder Resist (DFSR) superior in uniformity of film thickness, surface smoothness, and thin-film-forming property receives attention as the solder resist. Such DFSR can give the effects of simplification of resist-forming process, or reduction of solvent displacement in the resist-forming process, in addition to said characteristics.

In earlier days, the photo-curable and thermo-curable resin composition comprising an epoxy acrylate of novolak type or a polyfunctional acrylate in company with an acid-modified oligomer, a photo-initiator, and a thermo-curable binder has been used for forming the solder resist. However, such resin composition has disadvantages of that not only the alkali developing property is not sufficient but also the heat-resistant reliability of the solder resist formed therefrom is not so good.

SUMMARY OF THE INVENTION

It is an aspect of the present invention to provide a photo-curable and thermo-curable resin composition which makes it possible to provide a DFSR having superior heat-resistance and dimensional stability while exhibiting more improved alkali developing property.

It is another aspect of the present invention a DFSR exhibiting the properties of superior heat-resistance and dimensional stability.

BRIEF DESCRIPTION OF THE DRAWINGS

FIG. 1 is a process diagram roughly showing the process of preparing the DFSR by using the resin composition according to the present invention.

DETAILED DESCRIPTION OF THE EMBODIMENTS

The present invention provides a photo-curable and thermo-curable resin composition, comprising: an acid-modified oligomer having carboxyl group (—COOH) and photo-curable functional group; a photo-polymerizable monomer comprising a compound having a structure of that 3- or more functional epoxy acrylate groups are bonded to a heterocyclic structure containing nitrogen and a functional group having carboxyl group is bonded to at least one epoxy acrylate group; a thermo-curable binder having thermo-curable functional group; and a photo-initiator.

Furthermore, the present invention provides a dry film solder resist (DFSR), comprising a cured product of: an acid-modified oligomer having carboxyl group (—COOH) and photo-curable functional group; a photo-polymerizable monomer comprising a compound having a structure of that 3- or more functional epoxy acrylate groups are bonded to a heterocyclic structure containing nitrogen and a functional group having carboxyl group is bonded to at least one epoxy acrylate group; and a thermo-curable binder having thermo-curable functional group.

Hereinafter, the photo-curable and thermo-curable resin composition and the DFSR according to the embodiments of the present invention are explained in more detail.

According to one embodiment of the present invention, a photo-curable and thermo-curable resin composition, comprising: an acid-modified oligomer having carboxyl group (—COOH) and photo-curable functional group; a photo-polymerizable monomer comprising a compound having a structure of that 3- or more functional epoxy acrylate groups are bonded to a heterocyclic structure containing nitrogen and a functional group having carboxyl group is bonded to at least one epoxy acrylate group; a thermo-curable binder having thermo-curable functional group; and a photo-initiator is provided.

In the resin composition, a photo-polymerizable monomer comprising a compound having a certain structure is included in company with a certain acid-modified oligomer, a photo-initiator, and a thermo-curable binder. Particularly, the photo-polymerizable monomer has 3- or more functional, for example 3- to 6-functional, epoxy acrylate groups bonded to a heterocyclic structure having nitrogen, and functional groups having carboxyl group are bonded to one or more, for example 2 to 5, of the epoxy acrylate groups. Though the details will be explained below, the functional group having carboxyl group may be bonded to the hydroxyl group of the epoxy acrylate group, and the oxygen derived from the hydroxyl group, according to the reaction of the hydroxyl group of the epoxy acrylate group and the acid anhydride.

Since the photo-polymerizable monomer compound has a certain number of carboxyl groups, the carboxyl groups can improve the alkali developing property of the resin composition in company with the carboxyl group of the acid-modified oligomer. Namely, the carboxyl groups of the photo-polymerizable monomer make the resin composition dissolves in an alkali developing solution better, and make it possible to provide a resin composition showing superior developing property to prior known resin compositions (for example, the carboxyl group is included in the acid-modified compound only).

Furthermore, since the photo-polymerizable monomer compound comprises the heterocyclic structure containing nitrogen, it is possible to improve the heat-resistance of the DFSR formed by curing the resin composition more.

By extension, the carboxyl group of the photo-polymerizable monomer compound may be cross-linked with the undeveloped residue parts, for example the thermo-curable functional groups of thermo-curable binder such as epoxy group, oxetanyl group, cyclic ether group, or cyclic thioether group at the exposed part of the resin composition, and the epoxy acrylate group of photo-polymerizable monomer compound (for example, terminal double bonds of the epoxy acrylate group) may be cross-linked with the photo-curable functional groups of acid-modified oligomer, for example acrylate group or other functional groups having unsaturated double bond, by photo-curing. Consequently, if the resin composition according to the embodiment is photo-cured and thermo-cured so as to form the DFSR, it is possible to produce the DFSR having higher degree of cross-linking than prior known resin compositions (for example, comprising the acid-modified oligomer and just photo-curable polyfunctional acrylate). Therefore, the dimensional stability, the heat-resistance, or the mechanical property of the DFSR can be improved more.

Hereinafter, the resin composition according to one embodiment of the present invention is explained in more detail by each component.

Acid-Modified Oligomer

The resin composition according to one embodiment of the present invention comprises an acid-modified oligomer comprising carboxyl group (—COOH) and photo-curable functional group. The acid-modified oligomer can cross-link with other components of the resin composition, namely the photo-polymerizable monomer and/or the thermo-curable binder, and can form the DFSR by photo-curing process, and it gives the resin composition alkali developing property by comprising carboxyl group.

Such acid-modified oligomer may be an oligomer comprising carboxyl group and photo-curable functional group, for example acrylate group or curable functional group having unsaturated double bond in the molecule, any known compound which can be used in a photo-curable resin composition may be used without particular limitation. For example, the main chain of the acid-modified oligomer may be a novolak epoxy or polyurethane, and the acid-modified oligomer that carboxyl group and acrylate group are introduced to the main chain may be used. The photo-curable functional group may preferably be acrylate group, and the acid-modified oligomer may be obtained by copolymerizing the monomers comprising the polymerizable monomer having carboxyl group and the acrylate compounds.

More specifically, the examples of the acid-modified oligomer which can be used in the resin composition are as follows.

(1) A resin containing carboxyl group, obtained by copolymerizing an unsaturated carboxylic acid a such as (meth)acrylic acid and the like, and a compound b having unsaturated double bond such as styrene, α-methyl styrene, lower alkyl(meth)acrylate, iso-butylene, and the like.

(2) A photo-sensitive resin containing carboxyl group, obtained by reacting a compound having an ethylenically unsaturated group such as vinyl group, allyl group, (meth)acryloyl group, and the like, and a reacting group such as epoxy group, acid chloride, and the like, for example glycidyl (meth)acrylate, with the part of the copolymer of the unsaturated carboxylic acid a and the compound b having unsaturated double bond, and further adding an ethylenically unsaturated group thereto as a pendant group.

(3) A photo-sensitive resin containing carboxyl group, obtained by reacting the unsaturated carboxylic acid a with the copolymer of a compound c having an epoxy group and an unsaturated double bond such as glycidyl (meth)acrylate, α-methylglycidyl(meth)acrylate, and the like, and the compound b having unsaturated double bond, and further reacting a saturated or unsaturated polybasic acid anhydride d such as phthalic anhydride, tetrahydrophthalic anhydride, hexahydrophthalic anhydride, and the like, with the secondary hydroxyl group formed by prior reaction.

(4) A photo-sensitive resin containing carboxyl group, obtained by reacting a compound f having one hydroxyl group and at least one ethylenically unsaturated double bond such as hydroxyalkyl(meth)acrylate and the like with the copolymer of an acid anhydride e having unsaturated double bond such as maleic anhydride, itaconic anhydride, and the like and the compound b having unsaturated double bond.

(5) A photo-sensitive compound containing carboxyl group, obtained by carrying out esterification reaction (whole esterification or partial esterification, preferably whole esterification) between epoxy groups of a multifunctional epoxy compound g having two or more epoxy groups in the molecule, as disclosed below, or a multifunctional epoxy resin obtained by epoxidating hydroxyl group of the multifunctional epoxy compound with epichlorohydrin in addition, and carboxylic groups of a unsaturated monocarboxylic acid h such as (meth)acrylic acid and the like, and further reacting the saturated or unsaturated polybasic acid anhydride d with the hydroxyl group formed by prior reaction.

(6) A resin containing carboxyl group, obtained by reacting an organic acid i having one carboxylic acid in one molecule without an ethylenically unsaturated bond such as a $C_{2-17}$ alkyl carboxylic acid, an alkyl carboxylic acid containing aromatic group, and the like with the epoxy group of the copolymer of the compound b having unsaturated double bond and glycidyl(meth)acrylate, and further reacting the saturated or unsaturated polybasic acid anhydride d with the secondary hydroxyl group formed by prior reaction.

(7) An urethane resin containing carboxyl group, obtained by reacting a diisocyanate j such as an aliphatic diisocyanate, a branched aliphatic diisocyanate, an alicyclic diisocyanate, an aromatic diisocyanate, and the like, a dialcohol compound k comprising carboxyl group such as dimethylol propionic acid, dimethylol butanoic acid, and the like, and the middle part of diol compound m such as a polycarbonate-based polyol, a polyether-based polyol, a polyester-based polyol, a polyolefin-based polyol, an acryl-based polyol, a bisphenol A type alkyleneoxide adduct diol, a compound having phenolic hydroxyl group and alcoholic hydroxyl group, and the like.

(8) A photo-sensitive urethane resin containing carboxyl group, obtained by reacting the diisocyanate j, a (meth)acrylate or a partial acid anhydride-modified compound n of a bi-functional epoxy resin such as a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a bixylenol-type epoxy resin, a biphenol-type epoxy resin, and the like, the dialcohol compound k comprising carboxyl group, and the middle part of the diol compound m.

(9) An urethane resin containing carboxyl group, obtained by adding the compound f having one hydroxyl group and at least one ethylenically unsaturated double bond such as hydroxyalkyl(meth)acrylate and the like so as to introduce an unsaturated double bond to the terminal ends, during the reaction process of said (7) or (8).

(10) An urethane resin containing carboxyl group, obtained by adding a compound comprising one isocyanate group and one or more (meth)acryloyl group to the molecule prepared by an equimolar reaction of isophorone diisocyanate and pentaerythritol triacrylate, and (meth)acrylating the terminal ends, during the reaction process of said (7) or (8).

(11) A photo-sensitive resin containing carboxyl group, obtained by reacting the saturated or unsaturated polybasic acid anhydride d with the primary hydroxyl group of a modified oxetane compound obtained by reacting the unsaturated monocarboxylic acid h with a multi-functional oxetane compound having 2 or more oxetane rings in the molecule, as disclosed below.

(12) A photo-sensitive resin containing carboxyl group, obtained by introducing an unsaturated double bond to the reaction product of a bisepoxy compound and a bisphenol compound, and successively reacting the saturated or unsaturated polybasic acid anhydride d with the same.

(13) A photo-sensitive resin containing carboxyl group, obtained by reacting the saturated or unsaturated polybasic acid anhydride d with the reaction product obtained by reacting the unsaturated monocarboxylic acid h with the reaction product of a novolak-type phenol resin, and an alkyleneoxide such as ethyleneoxide, propyleneoxide, butyleneoxide, trimethyleneoxide, tetrahydrofuran, tetrahydropyran, and the like and/or a cyclic carbonate such as ethylenecarbonate, propylenecarbonate, butylenecarbonate, 2,3-carbonate propylmethacrylate, and the like.

Among said components, the acid-modified oligomer preferable in the point of flexibility of the DFSR can be obtained in the case of that the compounds having an isocyanate group used for synthesizing the resins of (7) to (10) do not comprise a benzene ring, and in the case of that the multi-functional and the bi-functional epoxy resins used for synthesizing the resins of (5) and (8) are linear compounds having bisphenol A backbone, bisphenol F backbone, biphenyl backbone, and bixylenol backbone, or hydrogenated compounds thereof. Furthermore, on the other aspect, the modified resins of (7) to (10) have urethane bond in their main chain and may be preferable in the point of bending.

Furthermore, the commercially obtainable compound may be used as the acid-modified oligomer, for example ZAR-2000 (Nippon Kayaku Co., Ltd.) and the like may be used.

Meanwhile, the acid-modified oligomer may be included in the content of about 20 to 50 weight % based on the total weight of the resin composition according to said embodiment, preferably about 25 to 45 weight %, and more preferably about 30 to 40 weight %. When the content of the acid-modified oligomer is excessively low, the developing property of the resin composition falls down and the strength of the DFSR may deteriorate, and when the content of the acid-modified oligomer is excessively high, the resin composition is excessively developed and the uniformity during coating may fall down.

Furthermore, the acid value of the acid-modified oligomer may be about 40 to 120 mgKOH/g, preferably about 50 to 110 mgKOH/g, and more preferably about 60 to 90 mgKOH/g. When the acid value of the acid-modified oligomer is excessively low, the alkali developing property may deteriorate, and when it is excessively high, it may be difficult to form a normal DFSR pattern because the photo-cured part, for example the exposed part, can also be dissolved by the developing solution.

Photo-Polymerizable Monomer

The resin composition according to said embodiment comprises a photo-polymerizable monomer comprising a compound having a specific structure. The photo-polymerizable monomer has a structure of that 3- or more functional, for example 3- to 6-functional, epoxy acrylate groups are bonded to a heterocyclic structure containing nitrogen and a functional group having carboxyl group is bonded to at least one, for example 2 to 5, epoxy acrylate groups. As the photo-polymerizable monomer comprising such compound has carboxyl group, the epoxy acrylate group and the carboxyl group participate the photo-curing and the thermo-curing respectively, and can form cross-link with the acid-modified oligomer and the thermo-curable binder, while improving the developing property of the resin composition more. Consequently, it raise the degree of cross-linking, and can improve the properties such as the dimensional stability, the heat-resistance, or the mechanical property.

For example, 3-functional epoxy acrylate may be bonded to the specific compound of the photo-polymerizable monomer, and said heterocyclic structure containing nitrogen may be

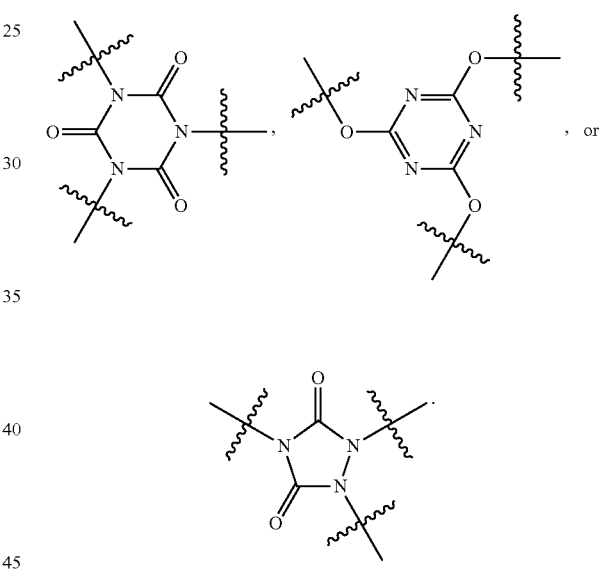

Namely, as 3-functional epoxy acrylates are bonded around the specific heterocyclic structure containing nitrogen having 3 bonding positions, it is possible to maximize the effect of improving the heat-resistant reliability of the DFSR due to the specific heterocyclic structure containing nitrogen, and it is also possible to optimize the degree of cross-linking of the DFSR and overall properties according to the same.

Furthermore, in the structure of the specific compound, the functional group having carboxyl group may be represented by the following Chemical Formula A, and the functional group may be bonded to at least one oxygen derived from hydroxyl group of the epoxy acrylate group:

[Chemical Formula A]

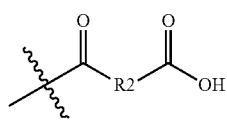

wherein, R2 is selected from the group consisting of

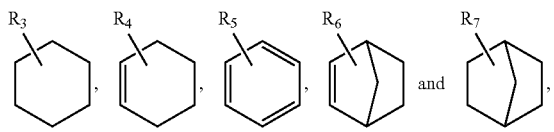

and $R_3$ to $R_7$ are independently hydrogen or a $C_{1-3}$ alkyl group.

The functional group comprising carboxyl group of the compound A is derived from an acid anhydride, it can be introduced by reacting with hydroxyl group of the epoxy acrylate group bonded to the heterocyclic structure containing nitrogen. As the functional group comprising carboxyl group is introduced, the developing property of the resin composition can be more improved, and the degree of cross-linking and overall properties of the DFSR also can be optimized.

Furthermore, for example, the specific compound of the photo-polymerizable monomer can be obtained by reacting the compound of which 3- or more functional epoxy group is bonded to the heterocyclic structure containing nitrogen with an acrylic acid compound so as to introduce 3- or more functional epoxy acrylate to the heterocyclic structure containing nitrogen, and reacting the same with an anhydride so as to introduce the functional group comprising carboxyl group thereto.

At this time, the number of functional groups having carboxyl group introduced to the epoxy acrylate group may be properly controlled by controlling the reacting mole ratio of the acid anhydride, for example, they may be introduced selectively to 2 to 5, preferably 2 to 4 among the groups of 3- to 6-functional epoxy acrylate. Furthermore, an adequate anhydride may be used by considering the desiderative properties such as developing property and degree of cross-linking, for example, the compound of Chemical Formula 5, more specifically, tetra hydro phthalic anhydride (THPA), hexa hydro phthalic anhydride (HHPA), methyl tetra hydro phthalic anhydride (MeTHPA), methyl hexa hydro phthalic anhydride (MeHHPA), nadic methyl anhydride (NMA), hydrolized methyl nadic anhydride (HNMA), phthalic anhydride (PAP), and the like may be used as the anhydride:

[Chemical Formula 5]

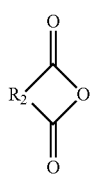

wherein, R2 is selected from the group consisting of

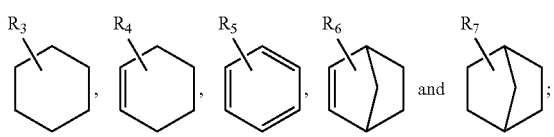

and $R_3$ to $R_7$ are independently hydrogen or a $C_{1-3}$ alkyl group.

Specific example of the compound obtainable above method may be the compound of Chemical Formula 1:

[Chemical Formula 1]

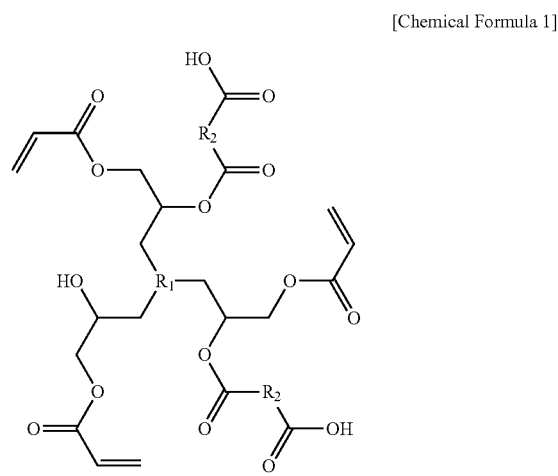

wherein, $R_1$ is

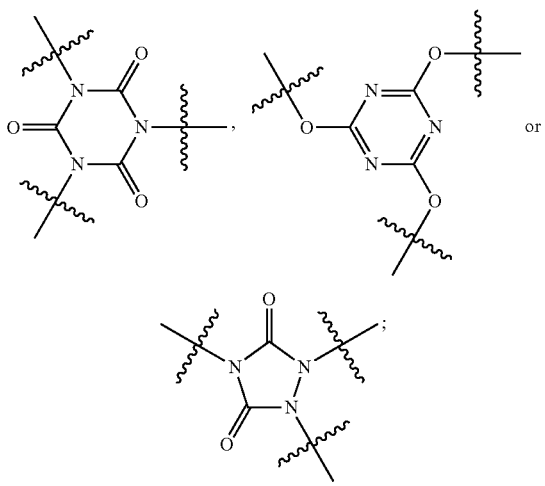

$R_2$ is selected from the group consisting of

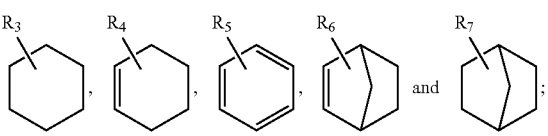

and $R_3$ to $R_7$ are independently hydrogen or a $C_{1-3}$ alkyl group.

The compound of Chemical Formula 1 may be prepared by a method comprising the steps of forming the polyfunctional epoxy acrylate compound of Chemical Formula 4 by reacting the compound of Chemical Formula 2 and the compound of Chemical Formula 3; and forming the compound of Chemical Formula 1 by reacting the polyfunctional epoxy acrylate compound of Chemical Formula 4 with the acid anhydride of Chemical Formula 5:

[Chemical Formula 2]

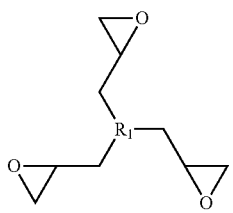

[Chemical Formula 3]

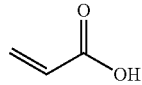

[Chemical Formula 4]

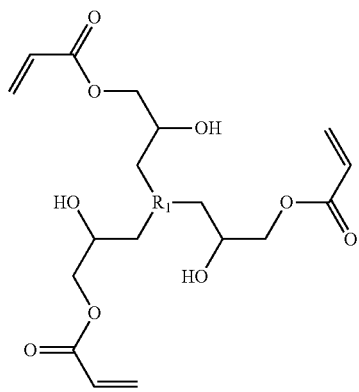

[Chemical Formula 5]

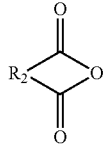

wherein, $R_1$ and $R_2$ are same as disclosed above.

The compound of Chemical Formula 1 is a compound having a structure of that 3-functional epoxy acrylate is bonded to the specific heterocyclic structure containing nitrogen and the functional group having carboxyl group is bonded thereto by bonding two hydroxyl groups of the epoxy acrylate and the acid anhydride of Chemical Formula 5, and it can improve the developing property of the resin composition, and can optimize overall properties such as degree of cross-linking or heat-resistance of the DFSR.

Meanwhile, the photo-polymerizable monomer may further comprise common polyfunctional acrylate compounds in addition to said compound having the specific structure. However, the photo-polymerizable monomer may comprise the compound having said specific structure of 5 weight % or more, preferably of 15 weight % or more, and more preferably 30 weight % or more and the other photo-polymerizable monomers in the residual quantity, in order to exhibit good developing property and heat-resistance.

As the other compounds usable as the photo-polymerizable monomer, for example, acrylate compounds having hydroxyl groups such as 2-hydroxyethyl acrylate, 2-hydroxypropyl acrylate, pentaerythritol triacrylate, dipentaerythritol pentaacrylate, and the like; water soluble acrylate compounds such as polyethyleneglycol diacrylate, polypropyleneglycol diacrylate, and the like; multi-functional polyester acrylate compounds of polyhydric alcohol such as trimethylolpropane triacrylate, pentaerythritol tetraacrylate, dipentaerythritol hexaacrylate, and the like; acrylate compounds of ethyleneoxide adducts and/or propyleneoxide adducts of polyfunctional alcohols such as trimethylol propane, hydrogenated bisphenol A, and the like, or polyphenols such as bisphenol A, biphenyl, and the like; polyfunctional or monofunctional polyurethane acrylate compounds which are isocyanate-modified compounds of said acrylates having hydroxyl group; epoxy acrylate compounds which are (meth)acrylic acid adducts of bisphenol A diglycidyl ether, hydrogenated bisphenol A diglycidyl ether, or phenol novolak epoxy resin; and photo-sensitive (meth)acrylate compounds of caprolactone-modified acrylates such as caprolactone-modified ditrimethylolpropane tetraacrylate, ϵ-caprolactone-modified dipentaerythritol acrylate, caprolactone-modified hydroxypivalic acid neopentylglycol ester diacrylate, and the like, and (meth)acrylate compounds corresponding to said acrylate compounds may be used, and said compounds may be used solely or by mixing two or more. Among these compounds, the polyfunctional (meth)acrylate compounds having two or more (meth)acryloyl groups in one molecule is preferable, and particularly, pentaerythritol triacrylate, trimethylolpropane triacrylate, dipentaerythritol hexaacrylate, caprolactone-modified ditrimethylolpropane tetraacrylate, and the like are preferable. Furthermore, as the compound on sale, DPEA-12 (Kayarad Co., Ltd.) and the like may be used. The content of the said photo-polymerizable monomer may be about 5 to 30 weight % based on the total weight of the resin composition, preferably about 7 to 20 weight %, and more preferably about 7 to 15 weight %. When the content of the photo-polymerizable monomer is excessively low, the photo-curing is not sufficiently done, and when the content is excessively high, the drying property of the DFSR gets bad and the properties may deteriorate.

Photo-Initiator

The resin composition of the embodiment comprises a photo-initiator. The photo-initiator takes a role of initiating the radical photo-curing at the exposure part of the resin composition.

As the photo-initiator, well-known compounds may be used, and benzoin and alkyl ethers thereof such as benzoin, benzoin methyl ether, benzoin ethyl ether, and the like; acetophenones such as acetophenone, 2,2-dimethoxy-2-phenyl acetophenone, 1,1-dichloro acetophenone, 4-(1-t-butyldioxy-1-methylethyl)acetophenone, and the like; anthraquinones such as 2-methyl anthraquinone, 2-amyl anthraquinone, 2-t-butyl anthraquinone, 1-chloro anthraquinone, and the like; thioxanthones such as 2,4-dimethyl thioxanthone, 2,4-diisopropyl thioxanthone, 2-chloro thioxanthone, and the like; ketals such as acetophenone dimethyl ketal, benzyldimethyl ketal, and the like; benzophenones such as benzophenone, 4-(1-t-butyldioxy-1-methylethyl)benzophenone, 3,3',4,4'-tetrakis(t-butyldioxycarbonyl) benzophenone, and the like may be used.

Furthermore, α-aminoacetophenones such as 2-methyl-1-[4-(methylthio)phenyl]-2-morpholinopropanone-1,2-benzyl-2-dimethylamino-1-(4-morpholinophenyl)-butane-1-on, 2-(dimethylamino)-2-[(4-methylphenyl)methyl]-1-[4-(4-morpholinyl)phenyl]-1-butanone, N,N-dimethylamino acetophenone (Irgacure® 907, Irgacure® 369, Irgacure® 379, and the like of Chiba Speciality Chemical Co., Ltd. (present Chiba Japan Co., Ltd.) as commercialized products); and acylphosphine oxides such as 2,4,6-trimethylbenzoyl diphenyl phosphine oxide, bis(2,4,6-trimethylbenzoyl)-phenyl phosphine oxide, bis(2,6-diimethoxybenzoyl)-2,4,4-trimethyl-pentyl phosphine oxide (Lucirin® TPO of BASF Co., Ltd., Irgacure® 819 of Chiba Speciality Chemical Co., Ltd., and the like as commercialized products) may be mentioned.

Furthermore, oxime esters may be used as the preferable photo-initiator. 2-(acetyloxyiminomethyl)thioxantene-9-on, (1,2-octanedion, 1-[4-(phenylthio)phenyl]-, 2-(O-benzoyloxime)), (ethanone, 1-[9-ethyl-6-(2-methylbenzoyl)-9H-carbazol-3-yl]-, 1-(O-acetyloxime)) and the like may be used as the specific examples of the oxime esters. As the products on the market, GGI-325, Irgacure® OXE01, and Irgacure® OXE02 of Chiba Speciality Chemical Co., Ltd., N-1919 of ADEKA Co., Ltd., and Darocur TPO of Chiba Speciality Chemical Co., Ltd. may be used.

The content of the photo-initiator may be about 0.5 to 20 weight % based on the total weight of the resin composition, preferably about 1 to 10 weight %, and more preferably about 1 to 5 weight %. When the photo-initiator is excessively low, it may not be photo-cured properly, and when it is excessively high, the resolution of the resin composition deteriorates and the reliability of the DFSR may be insufficient.

Thermo-Curable Binder

The resin composition of the embodiment also comprises a thermo-curable binder having thermo-curable functional group, for example at least one functional group selected from epoxy group, oxetanyl group, cyclic ether group, and cyclic thioether group. The thermo-curable binder can guarantee the heat-resistance and the mechanical property of the DFSR by cross-linking with the acid-modified oligomer and/or the photo-polymerizable monomer by thermo-curing process.

The softening point of the thermo-curable binder may be about 70 to 100° C., and the unevenness during lamination may be minimized through the same. When the softening point is low, tackiness of the DFSR increases, and when it is high, the flowability may be bad.

As the thermo-curable binder, a resin comprising two or more cyclic ether groups and/or cyclic thioether groups (hereinafter, 'cyclic (thio)ether group') in the molecule may be used, and a bi-functional epoxy resin also may be used. In addition to, a diisocyanate or a bi-functional block isocyanate thereof may be used also.

The thermo-curable binder comprising two or more cyclic (thio)ether groups in the molecule may be the compound having two or more groups, which are any one, or two or more groups selected from 3-, 4-, or 5-membered cyclic ether group and cyclic thioether group, in the molecule. Furthermore, the thermo-curable binder may be a polyfunctional epoxy compound comprising two or more epoxy groups in the molecule, a polyfunctional oxetane compound comprising two or more oxetanyl groups in the molecule, an episulfide compound comprising two or more thioether groups in the molecule, and the like.

As the specific example of the polyfunctional epoxy compound, a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a novolak-type epoxy resin, a phenol novolak-type epoxy resin, a cresol novolak-type epoxy resin, N-glycidyl-type epoxy resin, a novolak-type epoxy resin of bisphenol A, a bixylenol-type epoxy resin, a biphenol-type epoxy resin, a chelate-type epoxy resin, a glyoxal-type epoxy resin, an epoxy resin comprising amino groups, a rubber-modified epoxy resin, a dicyclopentadien phenolic-type epoxy resin, diglycidyl phthalate resin, a heterocyclic epoxy resin, a tetraglycidyl xylenoyl ethane resin, a silicone-modified epoxy resin, and a ε-caprolatone-modified epoxy resin, and the like may be used. Furthermore, the epoxy compounds to which phosphine atom and the like is introduced in the structure for giving a flame resistance also may be used. Such epoxy resins improve the adhering property, the soldering heat-resistance, the resistance to electroless plating, and the like of the cured film by being thermo-cured.

As the polyfunctional oxetane compound, an etherification product of an oxetane alcohol and a resin having hydroxyl group such as novolak resin, poly(p-hydroxystyrene), cardo-type bisphenols, calixarenes, calixresorcinarenes, silsesquioxanes, and the like may be used, in addition to polyfunctional extanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, an oligomer or copolymer thereof. In addition to, a copolymer of a unsaturated monomer having oxetane ring and an alkyl(meth)acrylate may be used.

As the compound having two or more cyclic thioether groups in the molecule, for example, a bisphenol A-type episulfide resin YL700 produced by Japan Epoxy Resin Co., Ltd. may be used. Furthermore, an episulfide resin of which oxygen atom of epoxy group of the novolak-type epoxy resin is substituted by sulfur atom may be used also.

Furthermore, as a compound on sale, YDCN-500-80P of Kukdo Chemical Co., Ltd. and the like may be used.

The thermo-curable binder may be included with the content corresponding to 0.8 to 2.0 equivalents per 1 equivalent of the carboxyl group of the acid-modified oligomer. When the content of the thermo-curable binder is excessively low, the carboxyl group remains in the DFSR even after curing, and the heat-resistance, the alkali-resistance, the electronic insulating property and the like may deteriorate. On the contrary, when the content is excessively high, it is not preferable because cyclic (thio)ether group of low molecular weight remains in the dried film and the strength of the film deteriorates.

Besides said components, the resin composition of the embodiment may further comprise a solvent; and at least one selected from the group consisting of a thermo-curable binder catalyst, a filler, a pigment, and an additives, disclosed hereinafter.

Thermo-Curable Binder Catalyst

The thermo-curable binder catalyst takes a role of accelerating the curing of the thermo-curable binder during thermal curing process.

As the thermo-curable binder catalyst, for example, imidazole derivatives such as imidazole, 2-methyl imidazole, 2-ethyl imidazole, 2-ethyl-4-methyl imidazole, 2-phenyl imidazole, 4-phenyl imidazole, 1-cyanoethyl-2-phenyl imidazole, 1-(2-cyanoethyl)-2-ethyl-4-methyl imidazole, and the like; amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimehtylbenzyl amine, and the like; hydrazine compounds such as adipic acid dihydrazide, sebacic acid dihydrazide, and the like; and phosphine compounds such as triphenyl phosphine and the like may be used. Furthermore, as the catalysts on sale, there are 2MZ-A, 2MZ-OK, 2PHZ, 2P4BHZ, and 2P4MHZ (product names of imidazole-based compounds) produced by Sikoku Kasei kogyo Co., Ltd., U-CAT3503N and UCAT3502T (product names of block isocyanate compounds of dimethylamine), and DBU, DBN, U-CATSA102, and U-CAT5002 (product names of bicyclic amidine compounds and their salt) produced by San Apro Co., Ltd. However, the catalyst is not limited to these, and may also be a thermo-cuing catalyst for the epoxy resins or the oxetane compounds, or a compound accelerating the reaction of the epoxy group and/or the oxetanyl group with the carboxyl group. The catalyst may be used solely or by mixing two or more. Furthermore, S-triazine derivatives such as a guanamine, an acetoguanamine, a benzoguanamine, a melamine, 2,4-diamino-6-methacryloyloxyethyl-S-triazine, 2-vinyl-4, 6-diamino-S-triazine, 2-vinyl-4,6-diamino-S-triazine.isocyanuric acid adduct, 2,4-diamino-6-methacryloyloxyethyl-S-triazine.isocyanuric acid adduct, and the like may be used, and preferably a compound which can function as a tackifier may be used in combination with the thermo-curable binder catalyst.

The content of the thermo-curable binder catalyst may be about 0.3 to 15 weight % based on the total weight of the resin composition, in an aspect of proper thermo-curing property.

Filler

The filer takes a role of improving the heat-resistant stability, the dimensional stability to heat, and the adhesive strength of the resin, and also acts as a body pigment by reinforcing the color.

As the filler, inorganic or organic fillers may be used, for example barium sulfate, barium titanate, amorphous silica, crystalline silica, fused silica, spherical silica, talc, clay, magnesium carbonate, calcium carbonate, aluminum oxide (alumina), aluminum hydroxide, mica, and the like may be used.

The content of the filler may be about 5 to 50 weight % based on the total weight of the composition. When the filler is used over about 50 weight %, it is not preferable because the viscosity of the composition becomes high and the coatability may deteriorate or the curing degree falls down.

Pigment

The pigment takes a role of hiding the defects such as scratches of the circuit lines by providing visibility and hiding power.

As the pigment, red, blue, green, yellow, and black pigments may be used. As the blue pigment, phthalocyanine blue, pigment blue 15:1, pigment blue 15:2, pigment blue 15:3, pigment blue 15:4, pigment blue 15:6, pigment blue 60, and the like may be used. As the green pigment, pigment green 7, pigment green 36, solvent green 3, solvent green 5, solvent green 20, solvent green 28, and the like may be used. As the yellow pigment, anthraquinone-based compounds, isoindolinone-based compounds, condensed azo-based compounds, benzimidazolone-based compounds, and the like may be used, for example, pigment yellow 108, pigment yellow 147, pigment yellow 151, pigment yellow 166, pigment yellow 181, pigment yellow 193, and the like may be used.

The content of the pigment may be about 0.5 to 3 weight % based on the total weight of the resin composition. When the pigment is used below about 0.5 weight %, the visibility and hiding power fall down, and when the pigment is used over about 3 weight %, the heat-resistance falls down.

Additive

The additive may be included for eliminating bubbles in the resin composition, eliminating popping or craters on the surface of the film during coating process, giving the flame resistance, and controlling the viscosity, and also may be included as a catalyst.

Specifically, well-known conventional additives, for example, a well-known conventional thickening agent such as micro silica powder, organic bentonite, montmorillonite, and the like; an antifoaming agent and/or a leveling agent such as a silicone-based compound, a fluorine-based compound, a polymeric compound, and the like; a silane coupling agent such as an imidazole-based compound, a triazole-based compound, a triazole-based compound, and the like; and a flame retardant such as a phosphine-based flame retardant, an antimony-based flame retardant, and the like may be mixed.

Among them, the leveling agent takes a role of eliminating popping or craters on the surface of the film during coating process, for example, BYK-380N, BYK-307, BYK-378, BYK-350, and the like produced by BYK-Chemie GmbH may be used.

The content of the additive may be preferably about 0.01 to 10 weight % based on the total weight of the resin composition.

Solvent

One or more solvent may be used together for dissolving the resin composition or giving proper viscosity thereto.

As the solvent, ketones such as methylethylketone, cyclohexanone, and the like; aromatic hydrocarbons such as toluene, xylene, tetramethylbenzene, and the like; glycol ethers (cellosolves) such as ethyleneglycol monoethylether, ethyleneglycol monomethylether, ethyleneglycol monobutylether, diethyleneglycol monoethylether, diethyleneglycol monomethylether, diethyleneglycol monobutylether, propyleneglycol monomethylether, propyleneglycol monoethylether, dipropyleneglycol diethylether, triethyleneglycol monoethylether, and the like; acetic acid esters such as ethyl acetate, butyl acetate, ethyleneglycol monoethylether acetate, ethyleneglycol monobutylether acetate, diethyleneglycol monoethylether acetate, diethyleneglycol monobutylether acetate, propyleneglycol monomethylether acetate, dipropyleneglycol monomethylether acetate, and the like; alcohols such as ethanol, propanol, ethylene glycol, propylene glycol, carbitol, and the like; aliphatic hydrocarbons such as octane, decane, and the like; petroleum solvents such as petroleum ether, petroleum naphtha, hydrogenated petroleum naphtha, solvent naphtha, and the like; and amides such as dimethyl acetamide, dimethylform amide (DMF), and the like may be used. These solvents may be used solely or by mixing two or more.

The content of the solvent may be about 10 to 50 weight % based on the total weight of the photo-sensitive resin composition. When the content of the solvent is below about 10 weight %, the viscosity is too high and the coatability falls down, and when the content is over about 50 weight %, the drying property becomes bad and the stickiness increases.

[Dry Film Solder Resist]

FIG. 1 is a process diagram roughly showing the process of preparing the DFSR by using the photo-curable and thermo-curable resin composition according to one embodiment.

Firstly, the resin composition is coated as a photo-sensitive coating material on a carrier film with a comma coater, a blade coater, a lip coater, a rod coater, a squeeze coater, a reverse coater, a transfer roll coater, a gravure coater, or a spray coater, and the like, and dried by passing the film through an oven of 50 to 130° C. for 1 to 30 minutes, and then a release film is laminated thereon so as to prepare a dry film composed of a carrier film, a photo-sensitive film, and a release film sequentially from the bottom. The thickness of the photo-sensitive film is preferably about 5 to 100 μm. At this time, plastic films such as polyethyleneterephthalate (PET) film, polyester film, polyimide film, polyamideimide film, polypropylene film, polystyrene film, and the like may be used as the carrier film, and polyethylene (PE) film, polytetrafluoroethylene film, polypropylene film, surface treated paper, and the like may be used as the release film, and it is preferable that the adhering force between the photo-sensitive film and the release film is lower than the adhering force between the photo-sensitive film and the carrier film.

Next, after peeling away the release film, the photo-sensitive film layer is adhered to a board on which a circuit is formed by using a vacuum laminater, a hot-roll laminater, a vacuum press, and the like.

And then, the substrate is exposed to a light having a certain wavelength range (UV and the like). The substrate may be exposed selectively by using a photo-mask, or pattern-exposed directly by using a laser direct exposure device. The carrier film is exfoliated after the exposure. The light exposure may be different according to the thickness of the film, and preferably 0 to 1,000 mJ/cm$^2$. When the light exposure is progressed, for example, photo-curing occurs at the exposed part and the cross-linking of the acid-modified oligomer and the photo-polymerizable monomer can be formed, and consequently the exposed part remains as the unremoved part after the developing process. On the other hand, the carboxyl group in the unexposed part is kept as it is, and it is possible to be developed.

After this, the substrate is developed by using an alkali solution. As the alkali solution, an aqueous alkali solution comprising potassium hydroxide, sodium hydroxide, sodium carbonate, potassium carbonate, sodium phosphate, sodium silicate, ammonia, amines, and the like may be used. According to the development, only the exposed part of the film can remain.

Finally, the printed circuit board comprising the solder resist prepared from the photo-sensitive film is prepared by thermo-curing (post cure) the same. At this time, it is preferable that the thermo-curing temperature is 100° C. or more.

According to said method, the DFSR and the printed circuit board comprising the same can be provided. Since the DFSR is prepared by photo-curing and thermo-curing of the resin composition, the DFSR may comprise the cured product of the acid-modified oligomer having carboxyl group (—COOH) and photo-curable functional group; the photo-polymerizable monomer comprising the compound having the structure of that 3- or more functional epoxy acrylate groups are bonded to the heterocyclic structure containing nitrogen and the functional group having carboxyl group is bonded to at least one epoxy acrylate group; and the thermo-curable binder having thermo-curable functional group.

More specifically, in the cured product, the carboxyl groups of the acid-modified oligomer and the compound included in the photo-polymerizable monomer may be cross-linked with the thermo-curable functional group, and the photo-curable functional group of the acid-modified oligomer may be cross-linked with the epoxy acrylate group of the compound included in the photo-polymerizable monomer. At this time, it can be recognized by identifying the cross-link between the photo-polymerizable monomer and the thermo-curable binder that the specific resin composition of the embodiment is used, and the formation of the cross-link can be identified by FT-IR and the like.

Like this, as the photopolymierizable monomer forms cross-links with both of the thermo-curable binder and the acid-modified oligomer, the degree of cross-linking may increase more, and overall properties such as heat-resistance or mechanical property may be improved more.

In addition to, the DFSR may further comprise a small quantity of photo-initiator, which is remained after the photo-curing process, dispersed in the cured product.

Since the resin composition of the present invention comprises the specific photo-polymerizable monomer, more improved alkali developing property can be obtained, and thus the heat-resistant reliability, the mechanical property, or the dimensional stability of the DFSR formed from the same can be improved more.

EXAMPLES

Hereinafter, the functions and the effects of the invention are explained in more detail, according to specific examples of the present invention. However, the following examples are only for explaining the present invention and the range of the present invention is not limited to or by them.

Examples 1-3

ZAR-2000 (Nippon Kayaku Co., Ltd.) of 38 weight % as the acid-modified oligomer; TGIC-modified monomer (photo-polymerizable monomer) of 9 weight % obtained by reacting THPA of 75 mol% with the hydroxyl group formed after reacting all of glycidyl groups of TGIC (Shina T&C Co., Ltd.) with acrylic acid (Example 1), or the photo-polymerizable monomer of 9 weight % in which the TGIC-modified monomer and A-DPH (6-functional acrylate) (Shin-Nakamura Chemical Co., Ltd.) are mixed in the ratio of 2:1 (Example 2) or 1:2 (Example 3); Irgacure® 819 (Chiba Speciality Chemical Co., Ltd.) of 3 weight % as the photo-initiator; YDCN-500-80P (Kukdo Chemical Co., Ltd.) of 16 weight % as the thermo-curable binder; 2-phenyl imidazole of 1 weight % as the thermo-curable binder catalyst; barium sulfate of 19 weight % as the filler; phthalocyanine blue of 0.5 weight % as the pigment, BYK-380N (BYK-Chemie GmbH) of 0.5 weight % as the additive; and DMF of 13 weight % as the solvent were mixed and stirred, and then the filler was dispersed in the composition by using 3 roll mill device, so as to prepare the photo-curable and thermo-curable resin composition.

A dry film composed of a carrier film, a photo-sensitive film, and a release film sequentially from the bottom was prepared by coating the resin composition on a carrier film (PET film) by using a comma coater, drying the same by passing through an oven of 75° C. for 8 minutes, and laminating a release film (PE film) thereon, A printed circuit board comprising the dry film solder resist formed from the photo-sensitive film was prepared by peeling off the release film of the prepared dry film, vacuum laminating the photo-sensitive film layer on a circuit board of which roughness is formed on the surface by using a vacuum laminator MV LP-500 (Meiki Seisakusho Co., Ltd.), exposing the same to UV light of 365 nm wavelength with 150 mJ/cm$^2$, eliminating the PET film, dipping the same in 1% Na$_2$CO$_3$ alkali solution of 31° C. being stirred for 60 seconds for development, and thermo-curing the same at 160° C. for 1 hour.

Comparative Examples 1-5

A printed circuit board comprising the dry film solder resist was prepared substantially according to the same method as in the Examples, except that M300 (Comparative Example 1) and M340 (Comparative Example 2) of Miwon Commercial Co., Ltd. which are 3-functional acrylates, and A-DPH (Comparative Example 3) of Shin-Nakamura Chemical Co., Ltd., and DCPA-60 (Comparative Example 4) and DCPA-120 (Comparative Example 5) of Nippon Kayaku Co., Ltd. which are 6-functional acrylates were respectively used as the photo-polymerizable monomer with the same amount, as disclosed in the following Table 1.

TABLE 1

| Functions | Product Name | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|
| Acid-modified oligomer | ZAR-2000 | 38 | 38 | 38 | 38 | 38 | 38 | 38 | 38 |
| Photo-polymerizable monomer | TGIC-modified monomer | 9 | 6 | 3 | | | | | |
| | M300 | | | | 9 | | | | |
| | M340 | | | | | 9 | | | |
| | A-DHA | | 3 | 6 | | | 9 | | |
| | DCPA-60 | | | | | | | 9 | |
| | DCPA-120 | | | | | | | | 9 |
| Photo-initiator | Irgacure 819 | 3 | 3 | 3 | 3 | 3 | 3 | 3 | 3 |
| Thermo-curable binder | YDCN-500-80P | 16 | 16 | 16 | 16 | 16 | 16 | 16 | 16 |
| Thermo-curable binder catalyst | 2-PI | 1 | 1 | 1 | 1 | 1 | 1 | 1 | 1 |
| Filler | Barium sulfate | 19 | 19 | 19 | 19 | 19 | 19 | 19 | 19 |
| Pigment | Phthalocyanine blue | 0.5 | 0.5 | 0.5 | 0.5 | 0.5 | 0.5 | 0.5 | 0.5 |
| Additive | BYK-380N | 0.5 | 0.5 | 0.5 | 0.5 | 0.5 | 0.5 | 0.5 | 0.5 |
| Solvent | DMF | 13 | 13 | 13 | 13 | 13 | 13 | 13 | 13 |

Experimental Examples

The properties of the dry film solder resists prepared in the Examples and Comparative Examples were measured as follows.

The soldering reliability was measured by the following method. A copper clad laminate (CCL), LG-T-500GA, of LG Chemical Co., Ltd. having thickness of 0.1 mm and copper thickness of 12 μm was cut into 5 cm×5 cm substrate, and micro-roughness was formed on the copper surface by chemical etching. A specimen was prepared by peeling off the release film of the prepared dry film of 35 μm, vacuum laminating the photo-sensitive film layer on the circuit board of which the roughness is formed on the surface by using a vacuum laminator MV LP-500 (Meiki Seisakusho Co., Ltd.), exposing the same to UV light of 365 nm wavelength with 150 mJ/cm$^2$, eliminating the PET film, dipping the same in 1% $Na_2CO_3$ alkali solution of 31° C. being stirred for 60 seconds for development, and thermo-curing the same at 160° C. for 1 hour. The specimen was coated with a rosin-based flux and dipped in a soldering bath of 260° C. for 60 seconds, and then the state of the specimen was observed.

A PCT heat-resistance was measured by the following method. The specimen was prepared as same as in the soldering test, and the state of the specimen was observed after putting the same in a tester device of 121° C., 2 atm, and humidity of 100% for 192 hours.

A developing property was measured by the following method. The micro-roughness was formed on the copper surface of the copper clad laminate (CCL), LG-T-500GA, of LG Chemical Co., Ltd. having thickness of 0.1 mm and copper thickness of 12 μm by chemical etching. After peeling off the release film of the prepared dry film of 35 μm, the photo-sensitive film layer was vacuum laminated on the circuit board of which the roughness is formed on the surface by using a vacuum laminator MV LP-500 (Meiki Seisakusho Co., Ltd.). After eliminating the PET film, the specimen was put in a developing device spraying 1% $Na_2CO_3$ alkali solution of 31° C. with a pressure of 22 psi, and the time how long all of the laminated dry film was eliminated was measured.

A tensile strength and an elongation were measured by the following method. After peeling off the release film of the prepared dry film of 35 μm, the photo-sensitive film layer was vacuum laminated on the 12 μm shiny copper surface of 3EC-M3-VLP of Mitsui Metal Co., Ltd. by using a vacuum laminator MV LP-500 (Meiki Seisakusho Co., Ltd.). After a negative type mask to which lines having width of 5 mm and interval of 5 mm were drawn was put on the specimen, the specimen was exposed to UV light of 365 nm wavelength with 150 mJ/cm$^2$, and the PET film was eliminated, the specimen was dipped in 1% $Na_2CO_3$ alkali solution of 31° C. being stirred for 60 seconds for development, and thermo-cured at 160° C. for 1 hour. The copper layer of the specimen was eliminated by etching, and ribbon-type specimens having width of 5 mm were obtained. The properties were measured by using UTM Z010 device of Zwick Co., Ltd. The device was calibrated and operated according to the device manual. The length of specimen was 2 inches after installing the same between both clamps, and the experiment was carried out with the speed of 2 in/min. After the device was operated, the stress-strain curve was obtained until the specimen was broken. The tensile strength and the elongation were obtained from the curve, and higher tensile strength and elongation are advantageous for the crack.

A coefficient of thermal expansion was measured by the following method. The specimen was prepared as same as in the tensile strength and elongation test, and TMA/SDTA840 device of METTLER TOLEDO Co., Ltd. was used in the test. The device was calibrated and operated according to the device manual. The length of specimen was 10 mm after installing the same in the holder, and the length how long the specimen was elongated was measured while providing the force of 0.05N to both ends of the specimen and elevating the temperature with 10° C. per 1 minute from 50° C. to 200° C. The coefficient of thermal expansion α1 before the glass transition temperature was obtained as the slope of the elongated specimen from 70° C. to 80° C., the coefficient of thermal expansion α2 after the glass transition temperature was obtained as the slope of the elongated specimen from 170° C. to 180° C. Since the thermal expansion rate increases as the coefficient of thermal expansion is high, a problem of bending occurs in the high temperature process of mounting parts on the printed circuit board and it tends to be disadvantageous for the dimensional stability.

TABLE 2

|  | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| Soldering reliability | satisfactory | satisfactory | satisfactory | satisfactory | satisfactory | satisfactory | satisfactory | satisfactory |
| PCT heat-resistance | satisfactory | satisfactory | satisfactory | satisfactory | satisfactory | Bubbles were formed | Bubbles were formed | Bubbles were formed |
| Developing property (sec.) | 65 | 70 | 75 | 75 | 75 | 80 | 85 | 85 |
| Tensile strength (MPa) | 64.6 | 65.2 | 64.3 | 53.2 | 54.3 | 64.4 | 62.3 | 60.8 |
| Elongation (%) | 3.1 | 2.8 | 2.8 | 1.8 | 1.7 | 2.5 | 2.9 | 3.4 |
| Coefficient of thermal expansion (α1/α2) | 43.21/ 183.25 | 46.95/ 204.17 | 50.23/ 219.06 | 42.03/ 185.81 | 37.92/ 176.38 | 54.4/ 245.5 | 58.74/ 263.48 | 58.66/ 286 |

All Examples and Comparative Examples show satisfactory results in the soldering reliability but Comparative Examples 3-5 using the photo-polymerizable monomers having relatively long molecular length show a problem of that bubbles were formed on the surface in the PCT heat-resistance test.

In the developing property, it was recognized that Example 1 was most rapidly developed and most excellent.

In the tensile strength, Comparative Examples 1 and 2 of which the acrylates have lower functional group are about 10 MPa lower than other Examples, and their elongations are also lower than others, and thus it is recognized that they are disadvantageous for the mechanical properties.

In the coefficient of thermal expansion, it is recognized that Comparative Examples 3-5 are higher than other Examples and disadvantageous for the dimensional stability. Meanwhile, all of Examples 1-3 show preferable dimensional stability, however, as the content of TGIC-modified monomer decreases, the coefficient of thermal expansion increases and the dimentional stability decreases in order of Examples 2 and 3.

What is claimed is:

1. A dry film solder resist, comprising a cured product of:
    an acid-modified oligomer having a carboxyl group (—COON) and a photo-curable functional group;
    a photo-polymerizable monomer comprising a compound having a structure that three or more epoxy-acrylate groups are bonded to a heterocyclic structure containing nitrogen and a functional group having a carboxyl group is bonded to at least one epoxy acrylate group; and
    a thermo-curable binder having a thermo-curable functional group,
    wherein the dry film solder resist is formed on a circuit board having a conductive pattern in a dried and cured film form.

2. The dry film solder resist according to claim 1, wherein the carboxyl groups of the acid-modified oligomer and the compound included in the photo-polymerizable monomer are cross-linked with the thermo-curable functional group, and the photo-curable functional group of the acid-modified oligomer is cross-linked with the epoxy acrylate group of the compound included in the photo-polymerizable monomer, in the cured product.

* * * * *